METHOD OF MAKING A SEMICONDUCTOR DEVICE

Filed Sept. 30, 1960 2 Sheets-Sheet 1

INVENTORS
RICHARD J. BILLETTE,
STANLEY R. MORRISON
BY
Alan M. Stauffer
ATTORNEY

METHOD OF MAKING A SEMICONDUCTOR DEVICE

Filed Sept. 30, 1960

2 Sheets-Sheet 2

INVENTORS
RICHARD J. BILLETTE,
STANLEY R. MORRISON

BY Alan M. Staubly

ATTORNEY

United States Patent Office 3,157,937
Patented Nov. 24, 1964

3,157,937

METHOD OF MAKING A SEMICONDUCTOR DEVICE

Richard J. Billette, Excelsior, and Stanley R. Morrison, Hopkins, Minn., assignors to Honeywell Inc., a corporation of Delaware Filed Sept. 30, 1960, Ser. No. 59,759
8 Claims. (Cl. 29—25.3)

The present invention is concerned generally with the preparation of improved semiconductor devices such as rectifiers and transistors, and more specifically to an improved technique for treating the surface of a germanium semiconductor wafer in order to fabricate individual translator devices having more uniform and more predictable characteristics, one to another.

In the preparation of large numbers of semiconductor devices, the properties of the bulk material, the size and area of the junction areas, as well as certain other physical properties of the devices are relatively predictable and may be established in advance. These particular properties normally fall within certain predictable ranges. However, with regard to the semiconductor surface properties, the various characteristics and properties are normally neither uniform nor reproducible. Obviously, for uniformity of production, it is essential that the properties of the germanium wafer surface be generally predictable and substantially uniform from one unit to another. Generally speaking, it is preferable that the surface properties of a unit have a resistivity characteristic and type which substantially matches or is reasonably close to that of the bulk material. Because of certain requisite production steps which have significant side-effects upon the surface characteristics of the semiconductor device, and in particular heat treating of the device, and because of the timing sequence which is or may be critical in the over-all processing, steps must be taken to control the magnitude of the side effects which this requisite production process has upon the ultimate characteristics of the finished product. According to the present invention, a technique is provided which substantially stabilizes the surface properties of the wafer and which renders these properties uniform and predictable when subsequent requisite heat treating steps are undertaken with the unit.

In the encapsulation of semiconductor devices, particularly within hermetically sealed gaseous filled enclosures, it has been thought universally desirable to heat-treat the assembly prior to the final encapsulation operation. This heat treatment normally is conducted at a temperature of between 80° C. and 110° C. for a period of from several hours to several days, and is considered essential in order to reduce the water vapor content of the enclosure. Water vapor, if present in too large quantity, may be detrimental to the assembly and may cause the characteristics of the unit to fluctuate and vary from time to time during use. Even though a certain quantity of water vapor may remain in the unit, that is, the heat treatment may be carried out at least partially in an encapsulated or sealed unit, the properties of the surface of the device are rendered substantially more stable when the quantity of water vapor present in the sealed assembly is reduced. This is due to the discovery that the unit may be prepared in such a manner that fluctuations in characteristics which are expected to occur may be arranged to occur in a certain predetermined range without having any drastic over-all effect upon the performance of the completed unit. Stated another way, a certain rinsing treatment together with a subsequent heat treatment provides a finished product having the electrical properties of the surface maintained within a certain predetermined range. The normal fluctuations which are expected to occur after the unit is finished are such that there is no detrimental modification of the ultimate operating characteristics of the product.

Exposure of a germanium device to elevated temperatures tends to drive the surface of the device in the n-type direction. Such is the case when the final heat treatment steps are being undertaken with germanium devices, this step being necessary for characteristic stabilization purposes. Unless adequate steps are taken in advance of the final heat treating step, the surface will be driven too far in the n-direction and the gain and other operating characteristics may be adversely affected.

It has been found that additions of very small amounts of intentionally added impurities to the rinse water have an extremely significant effect upon the surface characteristics of the finished product. If the rinse water is free from added ions of this type, the surface will normally always be n-type. However, the addition of certain impurities to the rinse, particularly those from the group consisting of copper, antimony or silver will drive the surface in the p-type direction. The results with copper are substantially more satisfactory than those achieved with the other members of the group, antimony tending to lose its influence when used in the neutral rinse water, and silver forming a film on the surface and promoting an unreasonably high gain value. Therefore, while these other materials could be utilized and the effect achieved, most satisfactory results have been achieved with the use of copper.

In accordance with the present invention, a crystalline semiconductor device is prepared, fabricated, and etched in a suitable etching solution, such as, for example, a mixture of 80% and $HNO_3$–20% HF solution after which suitable electrode leads are attached to the unit, one electrode being disposed on the base, and one electrode to each rectifying area of the device. A forward electrical bias is initiated between the junction and base of the unit by means of the aforementioned electrode and it is immersed in a solution which includes a dilute quantity of copper ions. The term "forward electrical bias" is used in accordance with the definition generally accepted in the solid state art. For example, in a junction formed by p and n-type materials, a voltage source is connected thereto with the positive terminal contacting the p-type material and the negative terminal contacting the n-type material. Thus, the majority carriers of each conductivity type are injected into the junction area where combination occurs. The apparatus is retained in the rinse solution with the forward bias applied for a relatively short period of time, after which the unit may, if desired, be rinsed in a second rinsing batch which has a composition substantially identical to that of the first rinsing bath. The second rinsing is carried out under substantially identical conditions. Subsequent to the copper rinse, the unit is placed in a suitable encapsulating container and heat treated to stabilize the operating characteristics of the device. The heat treatment is carried out at a temperature ranging from 80° C. to 110° C. for a period ranging from several hours to several days. If desired, a portion of the heat treating may be conducted prior to the time the encapsulation is complete, that is, for example, prior to complete sealing of the enclosure. The effect of the copper treatment is to modify the conductivity characteristics of the surface of the crystal to a predetermined point, this modification being desirable because of the subsequent characteristic changes which occur during the essential heat treatment step. Thus the completed unit has certain surface characteristics which fall within a certain predetermined range.

Therefore, it is an object of the present invention to provide an improved surface treating technique for use in connection with semiconductor devices, the treatment providing increased uniformity and predictability of surface conditions in the finished product.

It is still a further object of the present invention to provide an improved electrolytic rinsing technique in which the etched semiconductor body is treated subsequent to the etching operation per se.

It is yet another object of the present invention to provide an improved electrolytic etching technique coupled with an improved heat treating operation, the combined treatment yielding semiconductor devices having highly uniform and predictable output characteristics.

Other and further objects of the present invention will become apparent to those skilled in the art upon a study of the following specification, appended claims and accompanying drawings wherein:

Figure 1:
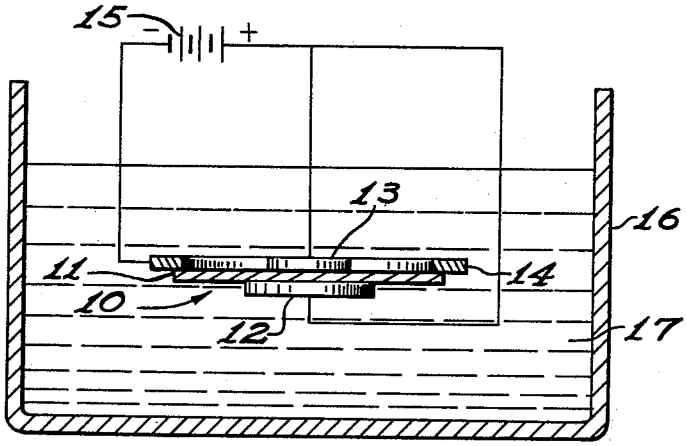
FIGURE 1 is a diagrammatic view, partially in section, showing a bath capable of carrying out the rinsing technique of the present invention.

In accordance with the preferred technique of the present invention, a semiconductor unit such as the transistor generally designated 10 is fabricated in accordance with conventional techniques well known in the art and comprises a germanium wafer body unit 11 together with an indium alloyed junction collector unit 12 and an indium alloyed junction emitter 13. A suitable base ring 14 is arranged in soldered contact with the surface of the wafer 11, and is preferably arranged annularly about the emitter junction 13. Suitable leads are arranged to be attached to the semiconductor unit and electrical contact is arranged to be made to the unidirectional electrical source 15, the preferred energy source being a battery. For convenience of handling, stainless steel clip leads may be utilized to make electrical contact with the various portions of the apparatus, and in order to avoid trouble due to the possible oxidation of the indium electrode in the electrolytic solution, the indium surface is preferably punctured by an electrode clamp prior to immersion in the bath. In the electrolytic bath portion, the tank 16 is arranged to retain the copper containing rinsing solution 17.

For best results in connection with the technique of the present invention, it is preferred that the last etch be an etch which consists essentially of nitric acid and hydrofluoric acids, preferably in the range of 80%–20% respectively. It will be appreciated, however, that certain other of the commonly used etches may be employed, but preferably not those which include as a constituent thereof a strong oxidizing agent such as bromine or the like. It has been found that the finished product has a more desirable breakdown voltage characteristic or level when the final etch does not include an excessively strong oxidizing agent. With the appropriate electrical leads as indicated diagrammatically in FIGURE 1 attached, the unit is immersed in the electrolytic rinse bath with a suitable forward electrical bias placed thereon. The rinsing time is preferably about three minutes under these conditions, and the specific electrolytic rinse may be repeated a second time, if desired.

Figure 3:
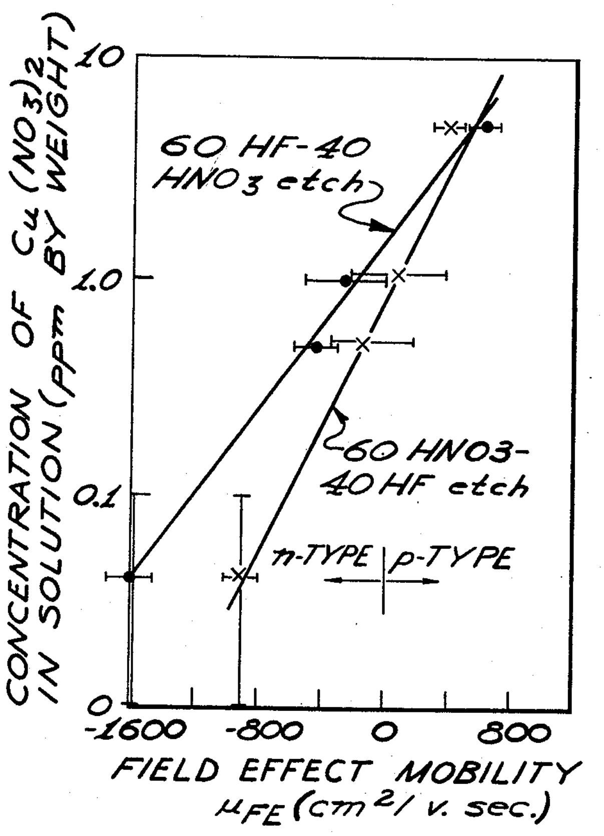
Figure 2:
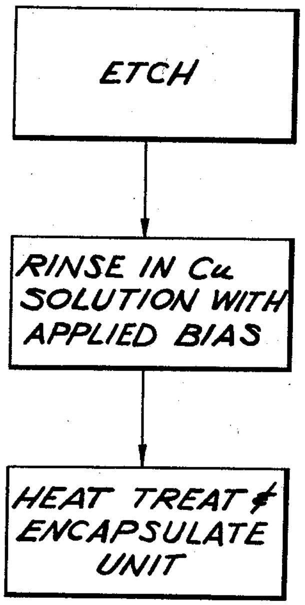
FIGURE 2 is a flow chart showing the various steps which are carried out in the preparation of a typical semiconductor device and utilizing the improved techniques of the present invention; and, FIGURES 3 and 4 are graphical presentations illustrating the influence of certain processing steps in the surface properties of the semiconductor units.

Particular attention is directed to FIGURE 3 of the drawings which graphically illustrates the influence of copper ions in the rinse water, thereby making the surface p-type. Measurements of the field effect mobility are plotted as a function of the amount of copper nitrate added to the rinse water following an etch in $HNO_3$—HF. This relationship effectively demonstrates the effect which the copper has on the characteristics of the surface.

The copper is present in the rinse water preferably in the range of about six parts per million, however, as low as one part and up to 50 parts per million of copper may be satisfactorily utilized. It has been found, however, that below one part per million, the effect is not particularly noticeable even after an extensive period of rinsing, and in solutions containing over about 50 parts per million, a rather heavy or strong deposit of copper remains on the germanium surface, thereby causing unusually large surface leakage to occur. The degree of n-type surface desired in the finished product will basically determine the amount of copper desired in the rinse, and it has been found that for 5 ohm-cm. n-type germanium, about 6 p.p.m. of copper is substantially optimum. Pure distilled water is required for the preparation of the rinsing solutions, low resistivity distilled water or ordinary tap water not being satisfactory. However, distilled water such as that commonly used in the semiconductor industry, in which impurities are present in such small amounts that their effect is negligible, is satisfactory.

The effect of the forward electrical bias on the device while it is in the bath is to substantially neutralize the fields which are expected to be set up in the rinse water. For example, in the apparatus shown in FIGURE 1, a field will be set up between the indium and the nickel base ring as well as between these elements and the germanium surface. The bias arranged on this system has been found to be optimum at about 0.8 volt when 5 ohm-cm. germanium is utilized, this providing a reasonably good balance for the system. Without the voltage present, spotty results occur, wherein the copper may plate out indiscriminately along the surface of the germanium wafer, the degree of plating appearing to be a function of the immediate leakage occurring in the immediate integral areas. The magnitude of the applied voltage is therefore a delicate balance between the oxidation characteristics of the anodic portion of the cell and the plating tendency of the cathodic portion. The voltage should be such that there is no current transfer between the germanium surface immediately adjacent the emitter and collector junction areas and the electrolyte solution. For other systems, it is obvious that certain other voltages will be optimum depending upon the particular system under consideration, however, the voltage range is readily determinable by immersing the semiconductor wafer in a rinse solution which is highly concentrated in copper ions and thence applying a voltage which renders the area immediately adjacent the junction zone substantially free from a copper deposit, the areas adjacent the base ring of the wafer being freely coated with copper metal.

The anion portion of the rinse water is not considered critical, nitrates, chlorides or other halides being suitable. In this connection, however, copper iodide is desirable as a material for preparation of the rinsing solution inasmuch as its solubility in substantially pure water is limited to about ten parts per million. Therefore, a saturated solution of copper iodide may be employed which provides a rinsing solution having a substantially desired composition which remains reasonably uniform and does not become significantly modified with usage though loss of a portion of the copper electrolyte due to electrodeposition.

Figure 4:
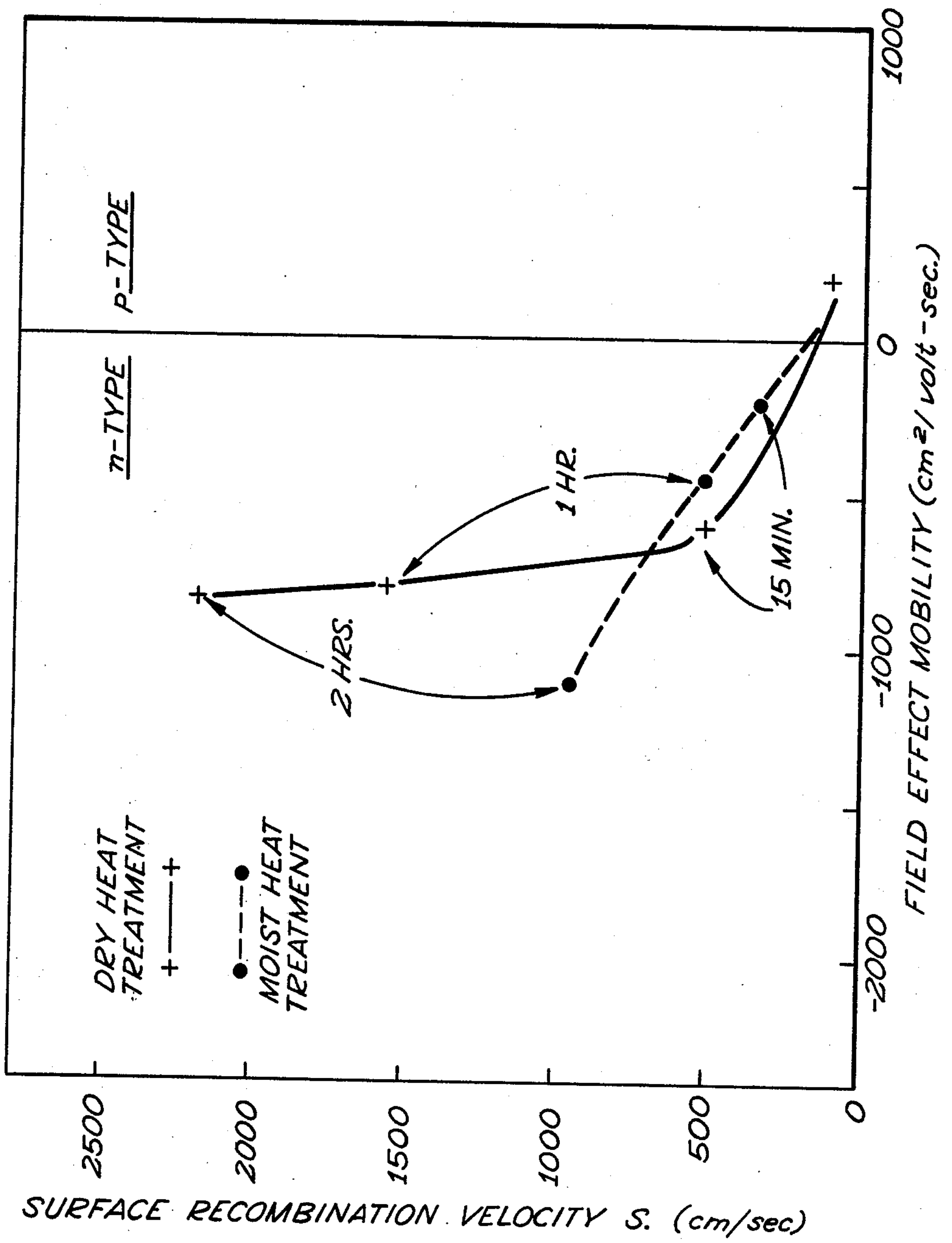

Following the immersion treatment, the semiconductor device is dried and subsequently mounted within any suitable enclosure. Preferably, however, the enclosure will be a permanent one and preferably one which comprises a metallic container hermetically sealed and filled with a desired gaseous ambient. While the heat treatment may be conveniently conducted or carried out in a single step, a two-stage or step treatment is generally preferred. In the first phase of the heat treatment cycle, the device is preferably maintained under reduced pressure or in a vacuum under a few millimeters of mercury pressure. A temperature of between 80° C. and 110° C. is held or maintained for a period of about three hours, this being effective in driving off a substantial portion of the water surface film, but not being effective in removing all of the water vapor. This treatment leaves an optimum quantity of water vapor along the surface of the device and in the enclosure, this quantity being desirable for the subsequent phase of the treating operations. After the initial heat treatment, the enclosure is flushed with a mixture of tank introgen and tank oxygen in a ratio of about 80%–20% respectively, this composition being relatively close to that of ordinary air. The enclosure is then sealed and a second heat treatment step is conducted. In this second heat treating step, the treatment is maintained for a longer period, preferably up to about 48 hours at a temperature of about 110° C. The effect of this heat treating operation is graphically presented in FIGURE 4 of the drawings. In this connection, the various individual samples in the family begin with a surface which is significantly p-type, having been rendered so by previous treatment in the copper rinse. The heat treatment drives the surface in the n-direction as indicated in each of the various curves of FIGURE 4. The rate at which the surface is driven in the n-direction is determined at least in part by the water vapor content, the lower the water vapor content of the ambient, the greater the rate at which the surface moves in the n-direction. The dry heat treatment outlined above is preferred because of the greater ease of control possible. It has been found that electrical properties of the surfaces are rendered substantially more stable when this heat treatment is carried out, the finished product being signficantly improved. The heat treatment is preferably carried out to a point at which the surface mobility may change without having any substantial effect on the gain of the unit. Thus, the heat treatment is ceased when the surfaces have been rendered n-type to such an extent that any change in the field effect mobility will not drastically alter the gain of the unit. Such a condition exists, of course, along the relatively flat areas of the curves representing the dry heat treatment of FIGURE 4. Caution must be observed to prevent the treatment from progressing to an extent such that minor changes in field effect mobility will cause substantial changes in gain to occur. This area is represented on the dry heat treatment curves by the point at which the gain begins to drop sharply with further heat treatment. For most purposes, the time-temperature ranges given above, may be satisfactorily utilized for germanium single crystalline wafers having n-type conductivity ranging from between about 4 ohm-cm. to 6 ohm-cm. Those skilled in the art may readily determine the optimum conditions for treatment of various semiconductor elements. Following the heat treatment, the semiconductor units are essentially free from creep, and the final operating characteristics are accordingly rendered more stable. The relative humidity during heat treatment is obviously quite pertinent. In FIGURE 4, the moist heat treatment is carried out at 100° C. in an atmosphere which corresponds to 100% R.H. at room temperature (about 7 mm. $H_2O$). For dry heat treatment the added atmosphere or ambient is substantially desiccated, the only water vapor present being retained along the surface of the device. One possible explanation for the effect of water vapor is based upon the assumption that the water vapor is dissolved in the oxide layer and may accordingly react with the fast states, possibly changing their energy level to an ineffective position. Dry heat treatment bakes off the water vapor, regenerating active fast states, and humid heat treatment encourages the transfer of water vapor back through the oxide deactivating the fast states. For most purposes, however, the two step heat treatment procedure outlined hereinabove provides uniformity in devices along with the ultimate preparation of units having desirable electrical characteristics.

It will, of course, be understood that various changes may be made in the form, details, arrangements and proportion of parts without departing from the scope of my invention, which generally stated consists in the matter set forth in the appended claims.

What is claimed is:

1. The method of stabilizing the electrical characteristics of an indium alloyed junction germanium semiconductor translating device which comprises the steps of immersing said device in a bath which consists essentially of an aqueous solution of cupric ions ranging from between about 1 and 50 parts per million of copper, maintaining a forward electrical bias on said semiconductor device between said junction and said germanium during said immersion, passing said device through a heating chamber wherein the temperature is maintained at a level between 80° C. and 110° C. for a period of about 3 hours, encapsulating said unit and passing the encapsulated unit through a heating zone wherein the temperature is maintained at a level of between 80° and 110° C. for a period of about forty-eight hours.

2. The method set forth in claim 1 being particularly characterized in that said heat treatment is carried out at a temperature of 100° C.

3. The method of stabilizing the electrical characteristics of a junction semiconductor device, the device including a single crystalline germanium wafer body, at least one indium fused junction arranged therein, and a base electrical contact along said wafer and spaced from said junction, said method comprising etching said device in a solution consisting of nitric acid and hydrofluoric acid, immersing said etched device in a bath which consists essentially of an aqueous solution of cupric ions ranging from between about 1 and 50 parts per million of copper, maintaining a forward electrical bias between the said junction and said base contact during immersion, passing the device through a first heat treating chamber wherein the temperature is maintained at a level between 80° C. and 110° C. for a period of about 3 hours, encapsulating said unit, and thence passing said encapsulated device through a second heat treating chamber wherein the temperature is maintained at a level of between 80° C. and 110° C. for a period of about forty-eight hours.

4. The method of treating the base surface of an etched germanium junction semiconductor device for assuring a substantial matching of the surface characteristics and the bulk characteristics thereof when in the finished state, said method comprising the steps of immersing said device in a bath consisting essentially of cupric ions ranging in concentration from about 1 to about 50 parts per million of copper to drive said surface characteristics in the p-type direction relative to said bulk characteristics and applying a forward electrical bias to said junction with respect to said base during said immersion to prevent said driving influence of said cupric ions in the area of said junction.

5. The method of treating the base surface of an etched germanium junction semiconductor device for assuring a substantial matching of the surface characteristics and the bulk characteristics thereof when in the finished state, said method of comprising the steps of immersing said device in a bath consisting essentially of a saturated solution of cupric iodide to drive said surface characteristics in the p-type direction relative to said bulk characteristics and applying a forward electrical bias to said junction with respect to said base during said immersion to prevent said driving influence of said bath in the area of said junction.

6. The method of treating the base surface of an etched germanium junction semiconductor device for assuring a substantial matching of the surface characteristics and the bulk characteristics thereof when in the finished state, said method comprising the steps of immersing said device in a bath which consists essentially of an aqueous solution of cupric ions ranging from about 1 to about 50 parts per million of copper to drive said surface characteristics in the p-type direction relative to said bulk characteristics and applying a forward electrical bias to said junction with respect to said base during said immersion to prevent said driving influence of said cupric ions in the area of said junction, the magnitude of said bias being selected at a predetermined value such that there is essentially no current transfer between said base adjacent said junction and said bath.

7. The method of treating the base surface of a junction semiconductor device for assuring a substantial matching of the surface characteristics and the bulk characteristics thereof, said method comprising the steps of immersing said device in a bath consisting essentially of an aqueous solution of cupric ions ranging in concentation from about 1 to about 50 parts per million of copper to drive said surface characteristics in the p-type direction relative to said bulk characteristics, applying a forward electrical bias to said junction with respect to said base during said immersion to prevent said driving influence of said bath in the area of said junction, and thence subjecting said device to a heat treating cycle wherein a temperature of from about 80° C. to about 110° C. is maintained for a period of at least three hours to drive the surface characteristics in the n-type direction by a predetermined amount thus substantially matching the surface and bulk characteristics of said device.

8. The method of treating the base surface of a semiconductor junction device for assuring a substantial matching of the surface characteristics and the bulk characteristics thereof, said method comprising the steps of immersing said device in a bath consisting essentially of an aqueous soluton of cupric ions ranging in concentration from about 1 to about 50 parts per million of copper to drive said surface characteristics in the p-type direction relative to said bulk characteristics and thence subjecting said device to a heat treating cycle wherein a temperature of from about 80° C. to about 110° C. is maintained for a period of from about three hours to about forty-eight hours to drive said surface characteristics in the n-type direction by a predetermined amount thus substantially matching the surface and bulk characteristics of said device.

References Cited in the file of this patent

UNITED STATES PATENTS

| | | |
|---|---|---|
| 2,758,261 | Armstrong et al. | Aug. 7, 1956 |
| 2,771,382 | Fuller | Nov. 20, 1956 |
| 2,859,394 | Berman | Nov. 4, 1958 |
| 2,874,448 | Haldeman | Feb. 24, 1959 |

FOREIGN PATENTS

| | | |
|---|---|---|
| 1,099,887 | France | Sept. 12, 1955 |

OTHER REFERENCES

Biondi: "Transistor Technology," published by D. Van Nostrand Co., Inc., 1958 (volume II, chapter 11, pages 597, 623–624, and 635–640 relied on).